(12) United States Patent
Lee et al.

(10) Patent No.: US 11,456,230 B2
(45) Date of Patent: Sep. 27, 2022

(54) HEAT RADIATION SHEET AND METHOD OF MANUFACTURING SAME

(71) Applicant: AMOGREENTECH CO., LTD., Gimpo-si (KR)

(72) Inventors: Seung Hoon Lee, Paju-si (KR); Yong Sik Jung, Namyangju-si (KR); Yun Mi So, Daejeon (KR)

( * ) Notice: Subject to any disclaimer, the term of this patent is extended or adjusted under 35 U.S.C. 154(b) by 181 days.

(21) Appl. No.: 17/016,832

(22) Filed: Sep. 10, 2020

(65) Prior Publication Data

US 2020/0411409 A1 Dec. 31, 2020

Related U.S. Application Data

(62) Division of application No. 14/611,518, filed on Feb. 2, 2015, now abandoned, which is a division of
(Continued)

(30) Foreign Application Priority Data

Aug. 6, 2012 (KR) .................. 10-2012-0085769
Jul. 29, 2013 (KR) .................. 10-2013-0089635

(51) Int. Cl.
*H01L 23/373* (2006.01)
*D01D 5/00* (2006.01)
*D01F 1/10* (2006.01)

(52) U.S. Cl.
CPC ......... *H01L 23/3733* (2013.01); *D01D 5/003* (2013.01); *D01F 1/10* (2013.01);
(Continued)

(58) Field of Classification Search
CPC combination set(s) only.
See application file for complete search history.

(56) References Cited

U.S. PATENT DOCUMENTS

2003/0000690 A1 1/2003 Chiu et al.
2006/0094320 A1 5/2006 Chen et al.
(Continued)

FOREIGN PATENT DOCUMENTS

KR 20040083573 10/2004
KR 20050062407 6/2005
(Continued)

OTHER PUBLICATIONS

Electrical and Mechanical Properties of Carbon-Black-Filled, Electrosoun Nanocomposite Fiber Webs, Journal of Applied Polymer Science, vol. 104, pp. 2410-2417, Jeesang Hwang, John Muth, Tushar Ghosh, Sep. 2006 (Year: 2006).*
(Continued)

*Primary Examiner* — Schyler S Sanks
(74) *Attorney, Agent, or Firm* — Cantor Colburn LLP

(57) ABSTRACT

Provided is a method of manufacturing a heat radiation sheet. The method includes the steps of: electrospinning a first spinning solution comprising an adhesive, first heat conductive particles, and a first solvent to form an adhesive layer in a form of a nano-web having a plurality of pores; mixing second heat conductive particles and a second solvent to obtain a second spinning solution; electrospinning the second spinning solution onto the adhesive layer to form an intermediate layer; mixing a polymer material, a third solvent, and third heat conductive particles to obtain a third spinning solution; and electrospinning the third spinning solution onto the intermediate layer to form a heat radiation layer in a form of a web on the intermediate layer.

8 Claims, 2 Drawing Sheets

Related U.S. Application Data application No. PCT/KR2013/006838, filed on Jul. 30, 2013.

(52) U.S. Cl.
CPC ...... *H01L 23/3737* (2013.01); *F28F 2255/06* (2013.01); *H01L 2924/0002* (2013.01)

(56) References Cited

U.S. PATENT DOCUMENTS

| | | | |
|---|---|---|---|
| 2008/0184886 A1* | 8/2008 | Tufts | G01N 30/12 977/833 |
| 2010/0006150 A1* | 1/2010 | Nishio | H01M 14/005 136/258 |
| 2010/0024975 A1 | 2/2010 | Hecht | |
| 2010/0084008 A1* | 4/2010 | Kim | H01G 9/2031 977/773 |
| 2010/0144228 A1 | 6/2010 | Branham et al. | |
| 2011/0046461 A1 | 2/2011 | Mckenna | |
| 2011/0259518 A1* | 10/2011 | Tojo | B32B 7/06 156/308.6 |
| 2012/0090825 A1* | 4/2012 | Yarin | C25D 7/00 977/890 |
| 2013/0085368 A1* | 4/2013 | Coggins | A61B 5/25 600/394 |

FOREIGN PATENT DOCUMENTS

| | | |
|---|---|---|
| KR | 20050113937 | 12/2005 |
| KR | 100725028 | 5/2007 |
| KR | 20070080546 | 8/2007 |
| WO | 2011102572 | 8/2011 |

OTHER PUBLICATIONS

Hwang, et al., Electrical and Mechanical Properties of Carbon-Black-Filled, Electrospun Nanocomposite Fiber Webs, Journal of Applied Polymer Science, vol. 104, 2006, pp. 2410-2417.

International Search Report—PCT/KR2013/006838 dated Nov. 19, 2013.

Lee, et al., Adhesion Characteristics of Carbon Black Embedded Glass/epoxy Composite, KAIST, 2009, pp. 1-31.

* cited by examiner

HEAT RADIATION SHEET AND METHOD OF MANUFACTURING SAME

TECHNICAL FIELD

The present invention relates to a heat radiation sheet that is mounted in an electronic device, to thereby radiate heat generated from the inside of the electronic device to the outside of the electronic device, and more particularly, to a heat radiation sheet that is made in the form of a nano-web form by way of an electrospinning method, and a method of manufacturing same.

BACKGROUND ART

Typically, electronic equipment such as computers, portable personal terminals, or communicator devices have serious concerns for residual image problems and an intrinsic system stability when excessive thermal energy generated from the inside of the electronic equipment is not be diffused to the outside thereof. This thermal energy may reduce the lifetime of the electronic equipment, or cause failure and malfunction of the electronic equipment, and in severe cases, may provide a cause of explosion or fire.

In particular, since the current electronic equipment gets slimmer in thickness, and is implemented to have higher performance, heat generated from various circuit components in the inside of the electronic equipment should be promptly radiated to the outside, to thus prevent the electronic equipment from being damaged due to the heat. Therefore, a heat radiation sheet is used in order to release the thermal energy generated from the inside of the electronic equipment to the outside thereof.

As disclosed in Korean Patent Registration Publication No. 10-0721462 (17 May 2007), a conventional heat radiation sheet includes: a metal plate with thermal conductivity; an adhesive foam sheet that is formed on at least one surface of the metal plate in the inside of which cells are formed as a foam structure, wherein the adhesive foam sheet is formed of an adhesive mixture containing an adhesive and a cell forming agent, the adhesive is an acrylic-based resin, a silicone-based resin or a polyurethane-based resin, and the cell forming agent is composed of a micro balloon.

However, since the conventional heat radiation sheet uses an adhesive foam sheet attached on a surface of a metal plate, the conventional heat radiation sheet becomes thick, to thus cause a problem of making it difficult to use the conventional heat radiation sheet in thin electronic equipment such as portable electronic equipment.

Further, the heat radiation sheet is blanked according to size of a heat generating component so as to be attached on the heat-generating component of the electronic equipment. However, since a foam sheet has adhesiveness, it is difficult to blank the heat radiation sheet precisely during blanking the conventional heat radiation sheet.

Technical Problem

To solve the above problems or defects, it is an object of the present invention to provide a heat radiation sheet and a method of manufacturing same, in which the heat radiation sheet is manufactured in a nano-web form by way of an electrospinning method, to thereby be made thin and to thus improve thermal conductivity.

In addition, it is another object of the present invention to provide a heat radiation sheet and a method of manufacturing same, in which an adhesive layer to be attached on a heat generating component is manufactured by an electrospinning method, to thereby enhance blanking performance, and a heat conductive material is contained in the adhesive layer, to thereby enable the adhesive layer to have heat radiation performance, and to thus enhance heat radiation performance of the heat radiation sheet.

The technical problems to be solved in the present invention are not limited to the above-mentioned technical problems, and the other technical problems that are not mentioned in the present invention may be apparently understood by one of ordinary skill in the art in the technical field to which the present invention belongs.

SUMMARY OF THE INVENTION

To accomplish the above and other objects of the present invention, according to an aspect of the present invention, there is provided a heat radiation sheet comprising: a heat radiation layer that is formed in the form of a nano-web having a plurality of pores by electrospinning a spinning solution that is obtained by mixing a polymer material and a solvent, or the polymer material, a heat conductive material, and the solvent; and an adhesive layer that is laminated on one surface or both surfaces of the heat radiation layer, and that is formed in the form of the nano-web by electrospinning an adhesive material that is obtained by an adhesive, the heat conductive material, and the solvent.

According to another aspect of the present invention, there is provided a heat radiation sheet comprising: a substrate that is formed in the form of a web by an electrospinning method; an adhesive layer that is laminated on one surface of the substrate; and a metal layer that is coated on the other surface of the substrate and having thermal conductivity.

According to still another aspect of the present invention, there is provided a method of manufacturing a heat radiation sheet comprising the steps of: forming an adhesive layer that is formed in the form of a nano-web by electrospinning an adhesive material that is obtained by an adhesive, a heat conductive material, and a solvent; and forming a heat radiation layer that is formed on one surface of the adhesive layer, and that is formed in the form of a web by electrospinning a spinning solution that is obtained by mixing a polymer material and a solvent, or the polymer material, the heat conductive material, and the solvent.

As described above, the heat radiation sheet according to the present invention is fabricated in a web form by an electrospinning method so as to be made thin and to have an advantage so as to be applicable to thin electronic equipment.

In addition, the heat radiation sheet according to the present invention is prepared in a web form by an electrospinning method, to thereby enhance blanking performance, in which a heat conductive material is contained in the adhesive layer, to thereby enhance heat radiation performance of the heat radiation sheet.

DETAILED DESCRIPTION OF THE INVENTION

Figure 1:
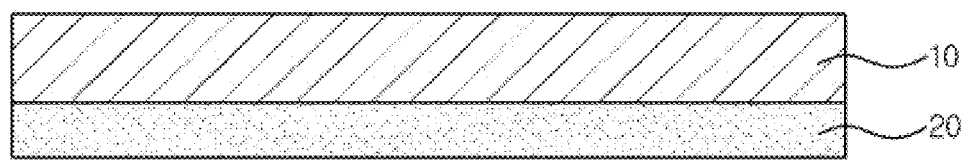
FIG. 1 is a cross-sectional view of a heat radiation sheet according to a first embodiment of the present invention.

Embodiments of the present invention will be described below in detail with reference to the accompanying drawings. Here, the size or shape of the components illustrated in the drawings may be shown to be exaggerated for convenience and clarity of illustration. In addition, specifically defined terms may be changed according to the intention or practices of users or operators in consideration of the construction and operation of the present invention. The definition of the terms should be made based on contents throughout the present specification.

Figure 2:
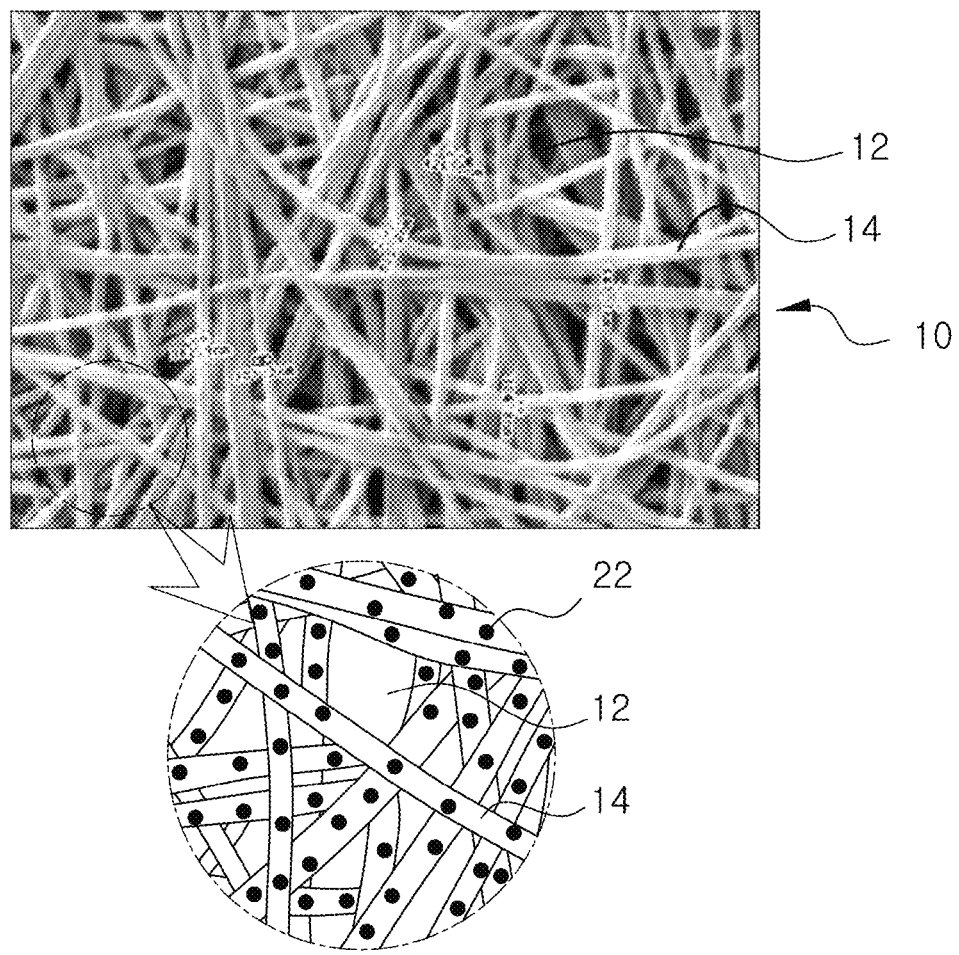
FIG. 2 is an enlarged view of a heat radiation layer according to the first embodiment of the present invention.

FIG. 1 is a cross-sectional view of a heat radiation sheet according to a first embodiment of the present invention, and FIG. 2 is an enlarged view of a heat radiation layer according to the first embodiment of the present invention.

Referring to FIGS. 1 and 2, the heat radiation sheet according to the first embodiment includes: a heat radiation layer 10 that is formed in a nano-web by an electrospinning method in which a heat conductive material is contained in the heat radiation layer 10, to thus have thermal conductivity; and an adhesive layer 20 that is laminated on one surface or both surfaces of the heat radiation layer 10.

The heat radiation layer 10 is formed by the following steps of: mixing a polymer material that can be electrospun and a solvent, or the polymer material, a heat conductive material, and the solvent at a constant mixture rate, to thus produce a spinning solution; electrospinning the spinning solution to thus form nanofibers 14; and accumulating the nanofibers 14 to thus form a nano-web having a plurality of pores 12. Here, the term "nano-web" can be called the 'web' for short.

Here, the spinning method that is applied to the present invention can employ any one selected from general electrospinning, air-electrospinning (AES), electrospray, electrobrown spinning, centrifugal electrospinning, and flash-electrospinning.

That is, the heat radiation layer 10 and the adhesive layer 20 according to the present invention may be fabricated by employing any spinning method selected from various kinds of spinning methods of accumulating nano-fibers.

For example, the polymer materials used to make the heat radiation layer 10 in the present invention may be: polyvinylidene fluoride (PVdF), poly(vinylidene fluoride-co-hexafluoropropylene), a perfluoropolymer, polyvinyl chloride, polyvinylidene chloride, or a copolymer thereof; a polyethylene glycol derivative containing polyethylene glycol dialkylether and polyethylene glycol dialkylester; poly(oxymethylene-oligo-oxyethylene); polyoxide containing polyethylene oxide and polypropylene oxide; polyvinyl acetate, poly(vinyl pyrrolidone-vinyl acetate), polystyrene, and a polystyrene acrylonitrile copolymer; a polyacrylonitrile copolymer containing polyacrylonitrile (PAN) and a polyacrylonitrile methyl methacrylate copolymer; or polymethyl methacrylate, a poly methyl methacrylate copolymer, or a mixture thereof.

Further, the heat conductive material employs any one selected from a heat conductive metal such as Ni, Cu, and Ag having excellent thermal conductivity, conductive carbon, carbon black, carbon nanotube (CNT), and conductive polymer (PDOT). Besides, any material having thermal conductivity may be used as the heat conductive material.

Here, when a spinning solution is fabricated by mixing heat conductive particles applied as a heat conductive material, a polymer material, and a solvent, the heat conductive particles 22 are dispersed in the nanofibers 14 of the heat radiation layer 10 that is in the form of the nano-web. That is, some parts of the heat conductive particles are exposed on the surface of the nanofibres 14 of the heat radiation layer 10, to then be involved in the heat conduction.

Since the heat radiation layer 10 is produced by an electrospinning method, the thickness of the heat radiation layer 10 is determined according to the dose of the electrospun spinning solution. Thus, it is advantageously easy to make the thickness of the heat radiation layer 10 into a desired thickness.

In this way, the heat radiation layer 10 is formed in a nano-web form where nanofibers are accumulated by a spinning method, to thus be made into a shape of having a large number of pores without a separate process, and to thus be possible to adjust size of each of the pores according to the dose of the spun spinning solution.

The adhesive layer 20 is prepared in the same way as an electrospinning method that is used for making the heat radiation layer 10. In other words, the adhesive layer 20 is prepared by the following steps of: mixing an adhesive having adhesiveness, a heat conductive material, and a solvent, to thus a heat conductive adhesive material having a viscosity appropriate for electrospinning; and laminating the heat conductive adhesive material on one surface or both surfaces of the heat radiation layer 10 with a predetermined thickness.

The adhesive layer 20 is spun in the form of ultrafine fiber strands and adhered on the surface of the heat radiation layer 10. In this case, the adhesive material is introduced into pores 12 of the heat radiation layer 10, to thus increase the adhesive strength between the heat radiation layer 10 and the adhesive layer 20. Therefore, a phenomenon that the heat radiation layer 10 is peeled off from the adhesive layer 20 is reduced, thereby improving the reliability of the heat radiation sheet. In addition, the thickness of the adhesive layer 20 is made thin by the adhesive material flowing into the pores 12, and thus the ultra-thin film heat radiating sheet may be realized.

The heat conductive material that forms the adhesive layer 20 is the same as the heat conductive material that forms the heat radiation layer 10.

Here, in addition to a method of directly electrospinning a heat conductive adhesive material on the heat radiation layer 10, it is also possible to use a method of separately preparing the heat radiation layer 10 and the heat conductive adhesive layer 20 by using an electrospinning method and then laminating the heat conductive adhesive layer 20 on one surface or both surfaces of the heat radiation layer 10 in a lamination process.

The thickness of the heat conductive adhesive layer 20 is determined in accordance with a dose of the spun heat conductive adhesive material. Therefore, it is possible to make the heat conductive adhesive layer 20 in a desired thickness.

Thus, since the adhesive layer 20 contains the heat conductive material, the adhesive layer 20 has thermal conductivity as well as adhesiveness in order to attach the heat radiation layer on the heat generating component, to thereby improve the heat radiation performance.

Meanwhile, in the present invention, the heat conductive particles may be dispersed and disposed between the heat radiation layer 10 and the adhesive layer 20.

The heat conductive particles are disposed at the outside of nanofibres of the heat radiation layer 10 and nanofibres of the adhesive layer 20 that are positioned on an interface between the heat radiation layer 10 and the adhesive layer 20, to thus better transfer heat generated from the heat generating component of the electronic equipment, and to thus increase the heat radiation efficiency.

Here, when the heat conductive particles and a solvent are mixed to create a spinning solution, and a bead made of the heat conductive particle and the solvent is spun on the nano-web of the adhesive layer 20, in the electrospinning process, the solvent is volatilized and the heat conductive particles are dispersed into the nano-web of the adhesive layer 20. Then, the nano-web of the heat radiation layer 10 is formed at the nano-web of the adhesive layer 20 to which the heat conductive particles are sprayed, and the heat conductive particles are dispersed and disposed between the above-mentioned heat radiation layer 10 and adhesive layer 20, to thereby manufacture the heat radiation sheet.

In the present invention, the heat radiation layer 10 quickly diffuses heat generated from heating elements such as LEDs, CPUs, or ICs, and prevents local temperature rise of the heating elements.

Figure 3:
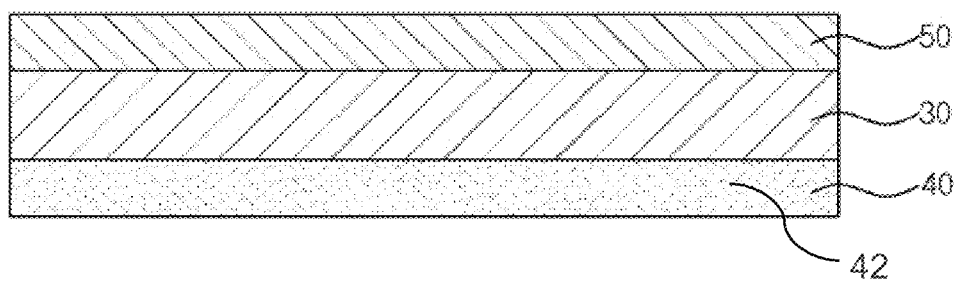
FIG. 3 is a cross-sectional view of a heat radiation sheet according to a second embodiment of the present invention.

FIG. 3 is a cross-sectional view of a heat radiation sheet according to a second embodiment of the present invention.

Referring to FIG. 3, the heat radiation sheet according to the second embodiment includes a substrate 30 that is formed in a nano-web shape by the electrospinning method, an adhesive layer 40 that is laminated on one surface of the substrate 30, and a metal layer 50 that is coated on the other surface of the substrate 30 and having thermal conductivity.

The substrate 30 is formed by the following steps of: mixing a polymer material and a solvent at a constant rate to thus produce a spinning solution having a viscosity so as to be electrospun; electrospinning the spinning solution to thus form nanofibers; and accumulating the nanofibers to thereby form the substrate 30 having a number of pores in a nano-web form.

Further, the substrate 30 may be formed in the same structure as the heat radiation layer 10 according to the first embodiment. That is, the substrate 30 may be formed of a polymer material to thereby have a structure of playing a role of supporting the metal layer. In addition, the substrate 30 may be formed of a polymer material containing a heat conductive material to thereby have a structure of playing a role of supporting the metal layer, as well as playing a heat conductive role.

Here, since the polymer material that forms the substrate 30 is the same as the polymer material described in the first embodiment, the detailed description thereof will be omitted.

Since the adhesive layer 40 is the same as the structure of the adhesive layer 20 described in the first embodiment, the detailed description thereof will be omitted.

The metal layer 50 is formed of a metal having thermal conductivity, such as Ni, Cu, or Ag. In addition to a method of coating the metal, a method of attaching a metal foil may be also used.

Thus, the heat radiation sheet according to the second embodiment is provided with the metal layer 50 having excellent thermal conductivity, to thereby further improve the heat radiation performance.

In the meantime, the metal layer 50 can be implemented into a metal pattern layer that is coated in a pattern shape on the other surface of the substrate 30, and the metal pattern layer has a larger contact area than the metal layer 50 having a face of a bulk shape, thereby increasing heat radiation efficiency.

Figure 4:
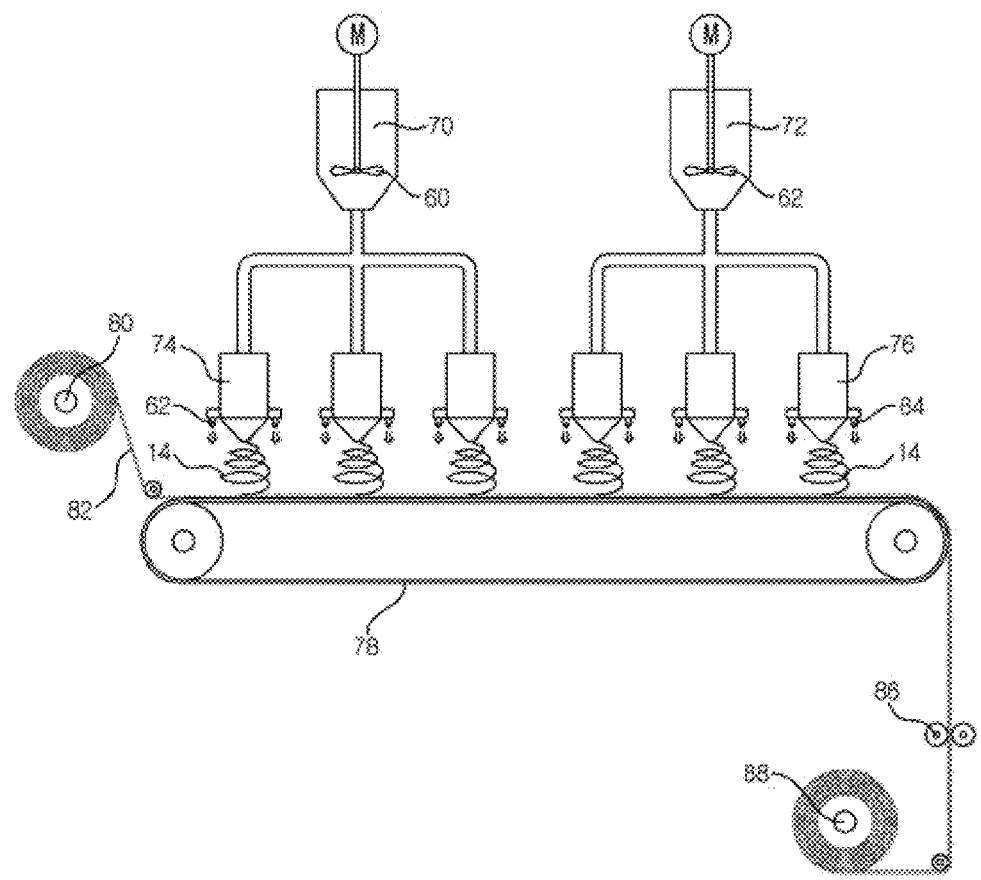
FIG. 4 is a configuration diagram of an electrospinning device for manufacturing a heat radiation sheet according to the present invention.

FIG. 4 is a configuration diagram of an electrospinning device for manufacturing a heat radiation sheet according to the present invention.

The electrospinning device according to the present invention includes: a first mixing tank 70 in which an adhesive material that is formed by a mixture of an adhesive, a heat conductive material, and a solvent is stored; a second mixing tank 72 in which a spinning solution that is formed by a mixture of a polymer material that can be electrospun, the heat conductive material, and the solvent is stored; a first spinning nozzle unit 74 that is connected to a high voltage generator and that is connected to the first mixing tank 70, for forming an adhesive layer 20; a second spinning nozzle unit 76 that is connected to the high voltage generator and that is connected to the second mixing tank 72, for forming a heat radiation layer 10; and a collector 78 that is to disposed below the first spinning nozzle unit 74 and the second spinning nozzle unit 76 and that sequentially laminates the adhesive layer 20 and the heat radiation layer 10.

The first mixing tank 70 is provided with a first agitator 60 that evenly mixes the adhesive, the heat conductive material, and the solvent and maintains a constant viscosity of the adhesive material, and the second mixing tank 72 is provided with a second agitator 62 that evenly mixes the polymer material, the heat conductive material, and the solvent and maintains a constant viscosity of the spinning solution.

In addition, a high voltage electrostatic force of 90 to 120 Kv is applied between the collector 78 and each of the first and second spinning nozzle units 74 and 76, to thereby spin nanofibers 14. Accordingly, the nanofibers 14 are collected on the collector 78, to thereby form a nano-web.

Here, the first and second spinning nozzle units 74 and 76 are arranged with a plurality of nozzles, respectively, which can be sequentially disposed in a single chamber or disposed in respectively different chambers.

The first spinning nozzle unit 74 and the second spinning nozzle unit 76 are provided with air spray apparatuses 62 and 64, respectively, to thus prevent the nanofibers 14 spun from the first spinning nozzle unit 74 and the second spinning nozzle unit 76 from fluttering without being collected by the collector 78.

A conveyor that automatically transfers the release film 82 so that the adhesive layer 20 and the heat radiation layer 10 are sequentially laminated on the release film 82 may be used as the collector 78. Otherwise, a table-shaped unit may be used as the collector 78 when the adhesive layer 20 and the heat radiation layer 10 are formed in respectively different chambers.

A release film roll 80 is disposed in front of the collector 78, in which the release film 82 is wound on the release film roll 80, to allow the release film 82 to be supplied on top of the collector 78. In addition, a pressure roller 86 that pressurizes (or performs calendaring) the adhesive layer 20 and the heat radiation layer 10 to have a constant thickness is provided at the rear side of the collector 78. A sheet roll 88 is provided, around which heat radiation sheets pressurized in a predetermined thickness via the pressure roller 86 are wound.

A process for producing the heat radiation sheet by using the electrospinning apparatus constructed as described above will be described as follows.

First, when the collector 78 is driven, the release film 82 wound on the release film roll 80 is released and supplied from the release film roll 80 to the collector 78.

Then, a high voltage electrostatic force is applied between the collector 78 and the first spinning nozzle unit 74, and thus the adhesive material is made into nanofibers 14 by the first spinning nozzle unit 74 to then be spun to the surface of the release film 82. As a result, the nanofibers 14 are accumulated onto the surface of the release film 82 to thus form the adhesive layer 20.

Here, since the adhesive layer 20 contains the heat conductive material, the adhesive layer 20 also plays a role of radiating heat for itself.

Here, when the first spinning nozzle unit 74 spins the nanofibers 14, an air spray apparatus 62 mounted in the first spinning nozzle unit 74 sprays air to the nanofibers 14, so that the nanofibers 14 can be collected and captured on the surface of the release film 82 without fluttering.

Then, when the adhesive layer 20 is completely manufactured, the adhesive layer 20 is moved to the bottom of the second spinning nozzle unit 76, and when a high voltage electrostatic force is applied between the collector 78 and the second spinning nozzle unit 76, the second spinning nozzle unit 76 spins the spinning solution into the nanofibers 14 and then spins the spun nanofibers 14 on the adhesive layer 20. As a result, the heat radiation layer 10 that is in a nano-web form and has a plurality of pores 12 is formed on the surface of the adhesive layer 20.

In this way, the finished heat radiation sheet is pressed to a predetermined thickness while passing through the pressure roller 86 and is wound on the sheet roll 88.

In addition to the above-described manufacturing method, it is possible to employ a method of manufacturing the heat radiation sheet including: separately preparing the heat radiation layer 10 and the adhesive layer 20; disposing the adhesive layer 20 on one or both surfaces of the heat radiation layered 10; and laminating between the heat radiation layer 10 and the adhesive layer 20.

Here, the heat radiation layer 10 and the adhesive layer 20 are formed on a transfer sheet that is one of nonwoven fabric, paper, and polyolefin-based film such as PE or PP, which is made of a polymer material that is not dissolved by the solvent used in the spinning solution, respectively, the heat radiation layer 10 and the adhesive layer 20 are laminated on each other, and then the transfer sheet is removed.

Further, when the heat radiating sheet is of a structure that the metal layer 50 is coated on the surface of the substrate 30 that is formed by the electrospinning method, the adhesive layer 40 and the substrate 30 are prepared in the same manner as described above, and the metal layer 50 is coated on the surface of the substrate 30, to thereby produce the heat radiation sheet.

Here, the substrate 30 may contain the heat conductive material in the same manner as the heat radiation layer 10 as described above. Furthermore, only a polymer material may be electrospun to produce the substrate 30, so as to play a role of the substrate without playing a role of the heat conductive performance.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

The present invention provides a heat radiation sheet that is manufactured in a nano-web form by way of an electrospinning method, to thereby be made thin so as to be applied to thin electronic equipment.

What is claimed are:

1. A method of manufacturing a heat radiation sheet comprising the steps of:
   electrospinning a first spinning solution comprising an adhesive, first heat conductive particles, and a first solvent to form an adhesive layer in a form of a web having a plurality of pores;
   mixing second heat conductive particles and a second solvent to obtain a spraying solution;
   electrospraying the spraying solution onto the adhesive layer to disperse the second heat conductive particles on the adhesive layer;
   mixing a polymer material, a third solvent, and third heat conductive particles to obtain a second spinning solution; and
   electrospinning the second spinning solution onto the adhesive layer and the dispersed second heat conductive particles to form a heat radiation layer in a form of a web on the adhesive layer with the second heat conductive particles dispersed between the adhesive layer and the heat radiation layer.

2. The method of manufacturing the heat radiation sheet of claim 1, further comprising: pressurizing the adhesive layer, the dispersed second heat conductive particles, and the heat radiation layer after forming the heat radiation layer.

3. The method of manufacturing the heat radiation sheet of claim 1, wherein the first heat conductive particles, the second heat conductive particles, the third heat conductive particles, or a combination thereof comprise a metal.

4. The method of manufacturing the heat radiation sheet of claim 1, wherein the first heat conductive particles, the second heat conductive particles, the third heat conductive particles, or a combination thereof comprise conductive carbon.

5. The method of manufacturing the heat radiation sheet of claim 1, wherein the first heat conductive particles, the second heat conductive particles, the third heat conductive particles, or a combination thereof comprise carbon black.

6. The method of manufacturing the heat radiation sheet of claim 1, wherein the first heat conductive particles, the second heat conductive particles, the third heat conductive particles, or a combination thereof comprise carbon nanotubes.

7. The method of manufacturing the heat radiation sheet of claim 1, wherein the first heat conductive particles, the second heat conductive particles, the third heat conductive particles, or a combination thereof comprise a conductive polymer.

8. The method of manufacturing the heat radiation sheet of claim 1, further comprising: coating a metal layer on a surface of the heat radiation layer opposite the adhesive layer.

* * * * *